United States Patent [19]
Clarke et al.

[11] Patent Number: 4,657,470
[45] Date of Patent: Apr. 14, 1987

[54] ROBOTIC END EFFECTOR

[75] Inventors: William F. Clarke, Sykesville, Md.; Mark W. Handlesman, Upper Darby, Pa.

[73] Assignee: Westinghouse Electric Corp., Pittsburgh, Pa.

[21] Appl. No.: 861,623

[22] Filed: May 6, 1986

Related U.S. Application Data

[63] Continuation of Ser. No. 671,670, Nov. 14, 1984, abandoned.

[51] Int. Cl.$^4$ .............................................. B65H 11/02
[52] U.S. Cl. .................... 414/627; 414/737; 414/225; 414/626; 414/752; 901/40; 403/2; 29/429; 29/729; 29/743; 294/64.1
[58] Field of Search ............... 414/729, 730, 732, 733, 414/734, 737, 738, 626, 627, 744 B, 752, 225; 901/40, 46, 49; 294/64.1, 64.2, 64.3, 65; 403/2; 221/211; 29/743, 429, 729; 10/72 R, 86 B

[56] References Cited

U.S. PATENT DOCUMENTS

| | | | |
|---|---|---|---|
| 2,681,757 | 6/1954 | Kellersman | 414/737 X |
| 3,581,911 | 6/1971 | Folk | 414/627 |
| 3,721,352 | 3/1973 | Messmer | 414/627 |
| 3,906,325 | 9/1975 | Salmon | 901/46 X |
| 4,261,681 | 4/1981 | Gates | 414/225 X |
| 4,305,130 | 12/1981 | Kelley et al. | 414/737 X |
| 4,397,188 | 8/1983 | Bansevichus | 901/46 X |
| 4,473,247 | 9/1984 | Itemdani et al. | |
| 4,484,854 | 11/1984 | Chitayat | 414/730 |

FOREIGN PATENT DOCUMENTS

| | | | |
|---|---|---|---|
| 271320 | 4/1964 | Australia | 414/627 |
| 3025952 | 2/1982 | Fed. Rep. of Germany | 403/2 |
| 3,215,228 | 11/1983 | Fed. Rep. of Germany | 403/2 |
| 324562 | 1/1930 | United Kingdom | |
| 967058 | 8/1963 | United Kingdom | |
| 1109152 | 6/1965 | United Kingdom | |
| 1316018 | 7/1971 | United Kingdom | |
| 1322856 | 10/1971 | United Kingdom | |
| 1307637 | 12/1971 | United Kingdom | |

Primary Examiner—Frank E. Werner
Attorney, Agent, or Firm—E. C. Arenz

[57] ABSTRACT

The invention comprises an improved end effector for a robot which is particularly advantageous in applications such as placing flat pack integrated circuits on circuit boards. The end effector includes a vacuum-operated quill for picking up the integrated circuit from a predetermined location. A pressure spring mechanism is included in the end effector permits the flat pack to be held in the desired position with a predetermined force by utilizing the robot arm to compress the pressure spring a predetermined amount. Once the integrated circuit is positioned on the circuit board, the circuit is released and the quill moved away from the board a predetermined distance by a linear actuator included in the end effector without any motion of the robotic arm.

6 Claims, 4 Drawing Figures

ROBOTIC END EFFECTOR

This application is a continuation of application Ser. No. 06/671,670, filed Nov. 14, 1984 now abandoned.

BACKGROUND OF THE INVENTION

1. Field of the Invention

The invention relates to robots and more specifically to end effectors for positioning components which permit the component to be released and the end effector to be moved away without requiring any motion of the robot arm.

2. Description of the Prior Art

Typical prior art end effectors required some motion of the robot arm in order to withdraw the end effector from contact with the components being placed. In many robots this withdrawal motion might include unwanted lateral or rotary motions. These motions could cause unintentional displacement of the components being placed.

REFERENCE TO RELATED PATENT APPLICATIONS

The end effector which is the subject of this application is useable with the robotic system which is the subject matter of co-pending U.S. patent application Ser. No. 540,066 now abandoned in favor of continuation application Ser. No. 834,494 which is assigned to the same assignee as this application.

SUMMARY OF THE INVENTION

The invention provides an improved end effector for robots permitting the end effector to be withdrawn from contact with the components being placed without requiring any motion of the robotic arm. More specifically, the preferred embodiment of the invention comprises an end effector specifically designed for placing flat pack integrated circuits on printed circuit boards. The end effector includes a tactile sensor permitting contact with the circuit board to be detected. After contact with the printed circuit board is detected, a predetermined force is applied to the integrated circuit being placed by a spring-loaded mechanism included in the end effector by moving the robotic arm a predetermined distance to compress the spring. After placement, the integrated circuit is released and the end effector withdrawn from contact with the integrated circuit utilizing a linear actuator forming a part of the end effector. This prevents the integrated circuit from being unintentionally displaced due to unintentional lateral or rotary motion of the robotic arm.

Additional features incorporated in the end effector include a tactile sensor. This sensor provides sufficient sensitivity to permit sensing of contact between either the integrated circuits being positioned and the adhesive layer on the circuit board or contact between the integrated circuit and the circuit board.

Although the end effector was specifically designed for placing flat pack integrated circuits on circuit boards, it may be used for other applications some of which may require modifications of the specific embodiment disclosed in this patent application.

BRIEF DESCRIPTION OF THE DRAWINGS

FIG. 24 is a fragmentary cross-sectional view of a portion of a quill used in the invention.

DESCRIPTION OF THE PREFERRED EMBODIMENT

Figure 1:
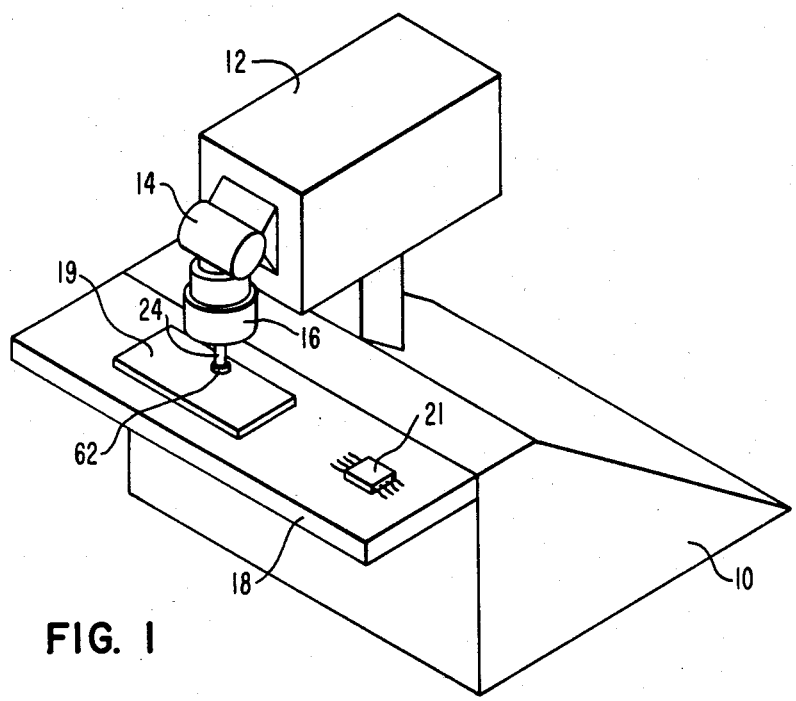
FIG. 1 is a diagram illustrating a robot utilizing the end effector comprising the invention.

FIG. 1 is a schematic diagram of a robot capable of utilizing the end effector comprising the preferred embodiment of the invention. More specifically, the robot includes a base member 10 provided for supporting the robot. As is conventional, the robot includes a movable arm 12 capable of being moved under control of the robotic controller in a vertical direction, a horizontal direction, as well as rotated about the vertical axis. Attached to the movable arm 12 is a wrist mechanism 14 which provides a rotary motion around the horizontal and vertical axis of the robot. Attached to the end of the wrist mechanism 14 is an end effector 16 which comprises the preferred embodiment of the invention. In use the robot would be programmed to move the end effector 16 to acquire components from a predetermined location within the working range of the movable arm 12 and to place these components on printed circuit boards 19 supported on the table 18 of the robot. For example, a typical integrated circuit 21 is positioned on the table 18 within the working range of robot arm 12 using any suitable means, including conventional means.

Figure 2:
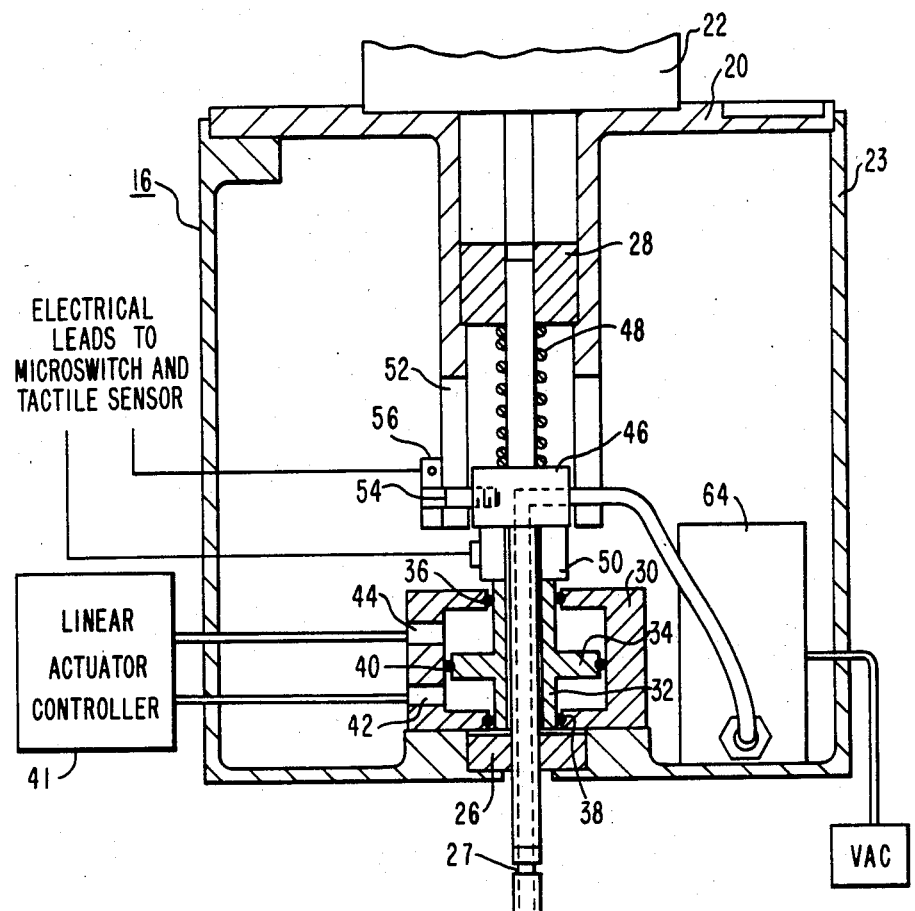
FIG. 2 is a cross-sectional drawing illustrating the end effector comprising the invention.

FIG. 2 is a cross-sectional diagram illustrating the features of the end effector 16. The end effector 16 includes a base member 20 which is affixed to the arm 22 of the robot using any conventional and convenient means. Affixed to the outer perimeter of the base member 20 is a housing member 23. A quill 24 moves up and down in a first oilite bearing 26, supported by the housing 23, and a second bearing 28 supported in the base member 20. The outer member 30 of a linear pneumatically actuated positioner is affixed to the housing 23. The inner member 32 of the pneumatically actuated linear positioner slidably encompasses the quill 24.

A pneumatic piston 34 is attached to the inner member 32 of the linear actuator. Three O-rings 36, 38 and 40 are respectively positioned between the inner member 32 and outer member 30, piston 34 and outer member 30 of the linear pneumatic actuated positioner. The linear pneumatic positioner is operated by a linear actuator controller 41. More specifically, to move the quill 24 upwardly the linear actuator controller 41 applies a higher pressure to the underside of the piston 34 through an opening 42 below the piston 34. Similarly, to move the quill downwardly, a higher pressure is applied to the upper side of the piston 34 through an opening 44 above the piston.

The upper portion of the quill 24 includes a collar member 46. A coil spring 48 positioned between the upper bearing 28 and the collar member 46 holds the quill in a downward position in the absence of any differential pressure being applied to the linear positioner piston 34. A tactile sensor 50 is slidably mounted on the quill member 24 below the collar member 46. The base member 20 includes a slot at reference numeral 52. A guide pin 54 extends through the slot 52 and is affixed to the collar member 46 utilizing a threaded end portion on the guide pin 54 and a tapped hole in the collar member 46. This permits the quill member 24 to move up and down vertically while restraining the horizontal rotation. Also affixed to the base member 20 is a microswitch 56 which is actuated by the guide pin 54. This permits a signal to be sent to the robot to indicate when the quill is in its extreme upper position resulting in maximum compression of spring 48.

The tactile sensor 50 includes an inner bore slightly larger than the shaft of the quill 24. This permits the tactile sensor to normally be subjected to a pressure between the collar 46, which is attached to the shaft of the quill, and the upper end of the inner member 32 of the linear actuator. A convenient means of adjusting this pressure is to change the constant of spring 48.

Commercially available piezoelectric devices may be conveniently used for tactile sensor 50.

Figure 3:
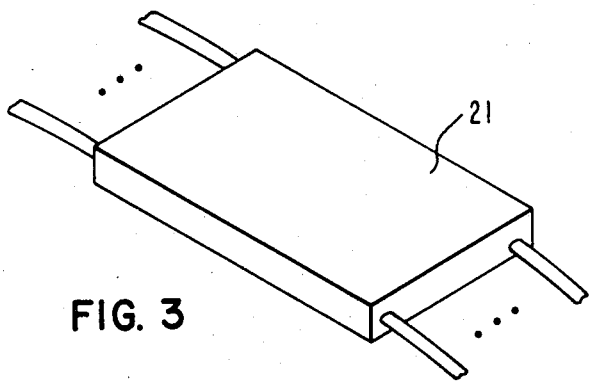
FIG. 3 is a drawing of a flat pack integrated circuit which may be placed utilizing the end effector comprising the invention.

In operation, it is contemplated that the end effector 16 will be utilized to acquire flat pack integrated circuits of the type generally illustrated at reference numeral 21 in FIG. 3. More specifically, in operation it is contemplated that the area of the printed circuit board where the flat packs are to be positioned will be pre-coated with a suitable adhesive. The robot controller will be programmed to move the robot arm 12 and the end effector 16 to a predetermined location where the integrated circuits are stored with a typical integrated circuit 21 illustrated in FIG. 1. The arm and wrist mechanisms 14 of the robot is operated to position the working tip of the quill and a small elastomeric tip affixed thereto, as generally illustrated at reference numeral 62 in FIG. 2, in contact with the upper surface of the integrated circuit. A vacuum controller 64 is actuated to produce a low pressure inside the quill 24 causing the integrated circuit, FIG. 2, to be held in contact with the quill.

After acquiring the integrated circuit as described above, the robot 12 will determine the orientation of the leads relative to the robot and the printed circuit board on which it is to be positioned using suitable position techniques. Then the robot arm will position the integrated circuit directly above the position on the circuit board 19 (FIG. 1) where it is to be mounted. In this position, the robot arm 12 will be moved downwardly until the tactile sensor 50 detects that the integrated circuit is in contact with the printed circuit board. After contact is established, the robotic arm 12 is moved downward a predetermined amount to compress the coil spring 48 and thereby apply a predetermined force to the integrated circuit to position it firmly in contact with the adhesive on the circuit board. Following application of the predetermined force, the vacuum controller is operated to remove the vacuum from the quill 24 and release the integrated circuit. After release of the integrated circuit the quill 24 will be moved upward by actuating the linear actuator controller 41 to apply a pressure to the underside of the piston 34 causing the quill to move upward and out of contact with the integrated circuit without imparting any substantial linear or rotational motion to the quill. After the quill is raised above the integrated circuit using the linear actuator, the robotic arm 12 is programmed to repeat the above operation until all the integrated circuits have been positioned in the desired location.

Figure 2A:
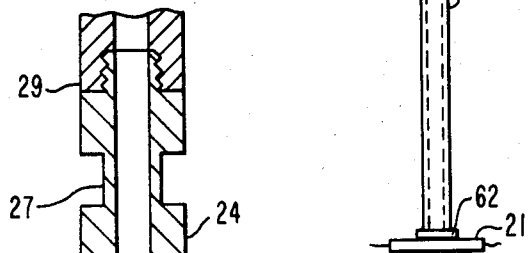

Quill member 24 (FIG. 2A) also includes a stress riser comprising a relatively deep groove in the outside edge of the quill. This groove has sufficient depth to assure that if unintended side loads are applied to the quill 24 that the quill will break at the stress riser 27. Additionally, the quill 24 includes a joint including comprising a threaded bore in the upper portion and a complementary threaded section on the lower portion, as generally illustrated at reference numeral 29. This feature permits a broken quill to be easily replaced thereby reducing maintenance cost.

The end effector which is the subject matter of this application can be constructed and assembled using conventional techniques. Actuators other than the linear pneumatic actuator illustrated may be used to move the quill 24 away from the integrated circuit after it is positioned on the circuit board.

We claim:
1. An end effector for a robot for placing small components such as flat packs on a surface, comprising:
  a housing adapted to be fixed to the movable arm of said robot, said housing including first and second bearings in spaced-apart relationship;
  a hollow quill slidably mounted in said bearings and having its bore open at the working end of said quill;
  means for coupling a selectively actuable vacuum source to said inner bore;
  a train of force responsive and force producing elements in coaxial relation with said quill and including:
    a collar fixed to said quill;
    a linear bidirectional actuator in coaxial and slidable relation to said quill and coupled to selectively actuable force-source means;
    resilient means biasing said collar and quill in a first direction corresponding to extending said quill and toward said actuator;
    tactile sensor means interposed in said train and subject to changing forces applied to said quill in a direction opposite said first direction in accordance with said quill being moved by said robot into a position placing a component held by the working end of said quill, said changing forces being used to initiate further action of said end effector including actuating said linear bidirectional actuator to move said quill in a direction opposite said first direction independent of any motion of said robot arm.

2. An end effector for use in a robot in accordance with claim 1 wherein said bidirectional actuator means further includes:
  (a) a cylinder having a first substantially constant radius inner wall, first and second end portions whose inner wall has a second radius less than said first substantially constant radius;
  (b) a piston having (1) a circular outer surface for mating with said inner wall of said cylinder, (2) first and second substantially flat end surfaces, (3) first and second rod-like portions respectively extending outward from said first and second end surfaces, the outer surfaces of said rod-like portion mating with said inner wall of said end portions;
  (c) means for selectively applying pressure to said first and second substantially flat end surfaces of said piston, thereby causing said piston to selectively move toward said first and second end portions.

3. An end effector for use in a robot in accordance with claim 2, wherein said bidirectional actuator further includes:
  (a) first and second "O" ring members respectively positioned around said first and second rod-like portions to form seals between said rod-like portions and the inner walls of said end portions;

(b) a third "O" ring member positioned between said inner wall of said cylinder and said outer surface of said piston to form a seal therebetween.

4. An end effector for use in a robot in accordance with claim 1, wherein said tactile sensor means comprises a piezoelectric sensor positioned around said quill and between said collar and said bidirectional actuator.

5. An end effector for use in a robot in accordance with claim 1, wherein said quill includes:

(a) a tube-like first portion having an inner bore terminating at a first end, the inner wall of said first end including a threaded portion;

(b) a second tube-like portion having a first end having a smaller diameter than the remainder of said second tube-like portion, the outer surface for said first end being threaded to mate with said first end of said first portion and a groove spaced from said first end, thereby assuring that excessive side loading will break at said groove.

6. An end effector for use in a robot in accordance with claim 1, wherein:

(a) said housing includes a slot substantially parallel to said quill;

(b) said collar includes a pin extending outwardly therefrom and through said slot; and (c) sensor means responsive to the position of said pin, thereby providing an indication of the tactile force applied to said quill.

* * * * *